United States Patent
Park et al.

(10) Patent No.: US 9,117,846 B2
(45) Date of Patent: Aug. 25, 2015

(54) METHOD OF MANUFACTURING OXIDE THIN FILM TRANSISTOR

(71) Applicant: LG Display Co., Ltd., Seoul (KR)

(72) Inventors: Sang-Moo Park, Goyang-si (KR); Bong-Chul Kim, Daegu (KR); Chan-Ki Ha, Incheon (KR); Jin-Woo Kwon, Daejeon (KR); Heung-Jo Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/055,553

(22) Filed: Oct. 16, 2013

(65) Prior Publication Data

US 2014/0147967 A1 May 29, 2014

(30) Foreign Application Priority Data

Nov. 29, 2012 (KR) .......... 10-2012-0136738

(51) Int. Cl.
*H01L 29/66* (2006.01)
*H01L 29/786* (2006.01)

(52) U.S. Cl.
CPC .... *H01L 29/66742* (2013.01); *H01L 29/66969* (2013.01); *H01L 29/7869* (2013.01)

(58) Field of Classification Search
CPC ............ H01L 27/1214; H01L 27/1288; H01L 29/42316; H01L 29/66462; H01L 29/66742; H01L 29/7787; H01L 29/66969; H01L 29/7869

USPC .......... 438/104, 172, 29, 34, 158; 257/57, 43, 257/72; 349/42, 43

See application file for complete search history.

(56) References Cited

U.S. PATENT DOCUMENTS

| | | | |
|---|---|---|---|
| 6,353,464 B1 * | 3/2002 | Noumi et al. ................ | 349/42 |
| 8,723,174 B2 * | 5/2014 | Nakazawa .................... | 257/43 |
| 2003/0075718 A1 * | 4/2003 | Jang et al. ................... | 257/72 |
| 2011/0147744 A1 * | 6/2011 | Jinbo et al. .................. | 257/57 |
| 2011/0163311 A1 * | 7/2011 | Akimoto et al. ............. | 257/43 |
| 2012/0135555 A1 * | 5/2012 | Choung et al. ............... | 438/34 |
| 2014/0339537 A1 * | 11/2014 | Bae ............................. | 257/43 |

FOREIGN PATENT DOCUMENTS

WO   WO 2011/151970   * 12/2011 ............ H01L 27/105

* cited by examiner

*Primary Examiner* — Mary Wilczewski
*Assistant Examiner* — James Chin
(74) *Attorney, Agent, or Firm* — Dentons U.S. LLP

(57) ABSTRACT

A method of manufacturing an oxide thin film transistor includes forming a gate electrode on a substrate; forming a gate insulating film the gate electrode; forming an oxide semiconductor layer on the gate insulating film; sequentially forming a lower data metal layer and an upper data metal layer on including the oxide semiconductor layer; forming an upper source pattern and an upper drain pattern by patterning the upper data metal layer by a wet etching; forming a lower source pattern and a lower drain pattern by patterning the lower data metal layer by a dry etching using the upper source pattern and the upper drain pattern as a mask to form a source electrode and a drain electrode; forming a first passivation film on the source and drain electrodes; performing a heat treatment on the oxide semiconductor layer; and forming a second passivation film on the first passivation film.

8 Claims, 4 Drawing Sheets

METHOD OF MANUFACTURING OXIDE THIN FILM TRANSISTOR

This application claims the benefit of Korean Patent Application No. 10-2012-0136738, filed on Nov. 29, 2012, which is hereby incorporated by reference as if fully set forth herein.

BACKGROUND OF THE INVENTION

1. Field of the Invention

The present invention relates to an oxide thin film transistor, and more particularly, to a method of manufacturing an oxide thin film transistor not including an etch stop layer.

2. Discussion of the Related Art

Image display devices, which display a variety of information on a screen, are a core technology of information and communication and are becoming increasingly thinner, lighter, more portable, and higher in performance. In particular, as needs for flexible displays with spatiality and convenience increase, organic light emitting diode display devices, which control light emission of an organic emitting layer, have recently received much attention as a flat panel display device.

An organic light emitting diode display device includes a substrate with thin film transistors (TFTs) formed thereon, organic light emitting diodes (OLEDs) formed on the substrate, and an encapsulation layer formed so as to cover the OLEDs.

The TFT is formed in each of sub-pixel regions defined by intersections of gate lines and data lines. The OLED that includes a first electrode, an organic emitting layer and a second electrode is connected to the TFT formed in each sub-pixel region.

In such OLED display devices, holes supplied from the first electrode and electrons supplied from the second electrode are injected into the organic emitting layer by electrical signals of the TFTs to form electron-hole pairs. The electron-hole pairs drop from an excitation state to a ground state, thereby emitting light.

In this regard, the TFT may be an amorphous silicon TFT, an oxide TFT, an organic TFT, and a poly-silicon TFT. The amorphous silicon TFT uses amorphous silicon for a semiconductor layer, while the oxide TFT uses an oxide such as indium gallium zinc oxide (IGZO), zinc oxide (ZnO), titanium oxide (TiO), or the like for a semiconductor layer. The organic TFT uses an organic material for a semiconductor layer, and the poly-silicon TFT uses poly-silicon for a semiconductor layer.

FIG. 1 is a sectional view of a general oxide thin film transistor.

As shown in FIG. 1, the general oxide TFT includes a substrate 10, and a gate electrode 11, a gate insulating film 12, an oxide semiconductor layer 13, source electrodes 15a and drain electrodes 15b, and a passivation film 16. In this regard, the oxide semiconductor layer 13 has a weak chemical resistance and thus is susceptible to an etchant for forming the source electrodes 15a and drain electrodes 15b. Thus, an etch stop layer 14 is further formed on the oxide semiconductor layer 13. The etch stop layer 14 is formed of a material such as $SiO_2$ or the like to prevent damage to the oxide semiconductor layer 13 when patterning the source electrodes 15a and drain electrodes 15b.

In this case, however, a process of patterning the etch stop layer 14 is further performed, thus increasing the manufacturing costs and time, which results in a reduced manufacturing yield. In particular, when the etch stop layer 14 is formed on the oxide semiconductor layer 13, there is limitation in reducing the width of the etch stop layer 14 because an overlay margin has to be considered. Accordingly, the length of channels increases and thus it is difficult to drive the oxide TFT at a high speed. In addition, the size of oxide TFT increases due to the etch stop layer 14, and an aperture ratio of an OLED display device including such oxide TFTs decreases.

SUMMARY OF THE INVENTION

Accordingly, the present invention is directed to a method of manufacturing an oxide thin film transistor that substantially obviates one or more problems due to limitations and disadvantages of the related art.

An advantage of the present invention is to provide a method of manufacturing an oxide thin film transistor in which exposure of an oxide semiconductor layer to an etchant may be prevented in formation of source and drain electrodes by forming the source and drain electrodes sequentially using wet and dry etching processes, without forming an etch stop layer.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method of manufacturing an oxide thin film transistor may include forming a gate electrode on a substrate; forming a gate insulating film on a front surface of the substrate including the gate electrode; forming an oxide semiconductor layer on the gate insulating film; sequentially forming a lower data metal layer and an upper data metal layer on the front surface of the substrate including the oxide semiconductor layer; forming an upper source pattern and an upper drain pattern by patterning the upper data metal layer by a wet etching; forming a lower source pattern and a lower drain pattern by patterning the lower data metal layer by a dry etching using the upper source pattern and the upper drain pattern as a mask to form a source electrode including the lower source pattern and the upper source pattern and a drain electrode including the lower drain pattern and the upper drain pattern and spaced apart from the source electrode; forming a first passivation film on the front surface of the substrate including the source and drain electrodes; performing a heat treatment on the oxide semiconductor layer; and forming a second passivation film on the first passivation film.

The first passivation film may include $SiO_2$.

The lower data metal layer and the upper data metal layer are sequentially formed by a sputtering method.

The upper data metal layer may include copper (Cu) or a Cu alloy.

The lower data metal layer may include at least one of molybdenum (Mo), titanium (Ti), an Mo alloy, and a Ti alloy.

The drain electrode may be spaced apart from the source electrode at a distance between 3 and 10 μm.

The dry etching may use a mixed etching gas including $SF_6$ and $O_2$ or a mixed etching gas including $CF_4$ and $O_2$.

Sulfur and fluorine remain in a separation region between the source and drain electrodes when the mixed etching gas including $SF_6$ and $O_2$ is used, and fluorine and carbon remain in the separation region between the source and drain electrodes when the mixed etching gas including $CF_4$ and $O_2$ is used.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Hereinafter, a method of manufacturing an oxide thin film transistor (TFT) according to an embodiment of the present invention will be described in detail with reference to the accompanying drawings.

FIGS. 2A through 2G are sectional views illustrating a method of manufacturing an oxide thin film transistor according to an embodiment of the present invention.

Figure 1:
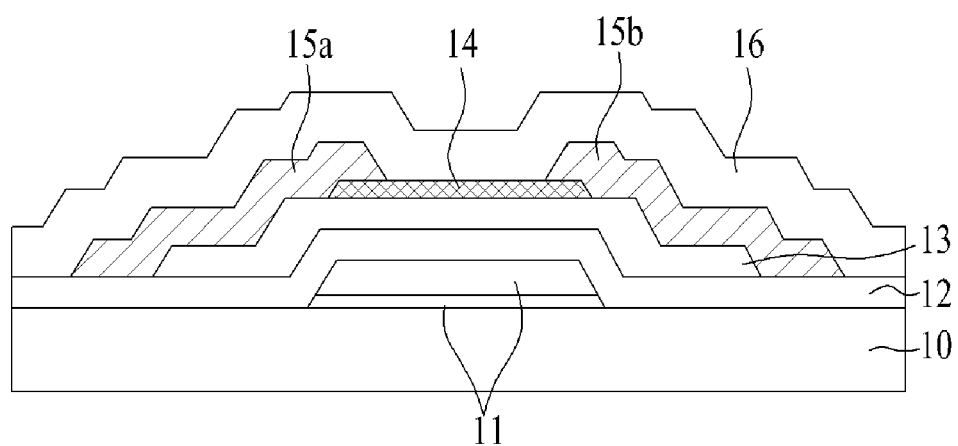
FIG. 1 is a sectional view of a general oxide thin film transistor.
Figure 2A:
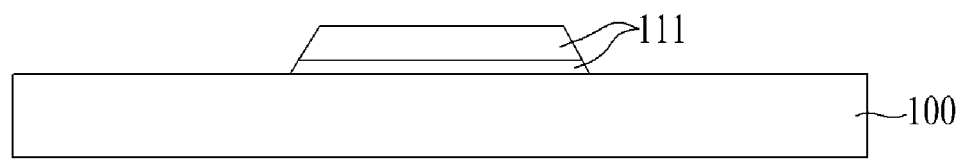
FIGS. 2A through 2G are sectional views illustrating a method of manufacturing an oxide thin film transistor according to an embodiment of the present invention.

As illustrated in FIG. 2A, a gate electrode 111 is formed on a substrate 100. The gate electrode 111 may have a single layer structure formed of a low-resistance opaque conductive material such as aluminum (Al), an Al alloy, tungsten (W), copper (Cu), nickel (Ni), chromium (Cr), molybdenum (Mo), an Mo alloy, titanium (Ti), platinum (Pt), tantalum (Ta), or the like, or a transparent conductive material such as indium tin oxide (ITO) or indium zinc oxide (IZO), or may have a multi-layer structure in which the opaque conductive material and the transparent conductive material are stacked together. FIGS. 2A to 2G illustrate the gate electrode 111 as having a two-layer structure.

Figure 2B:
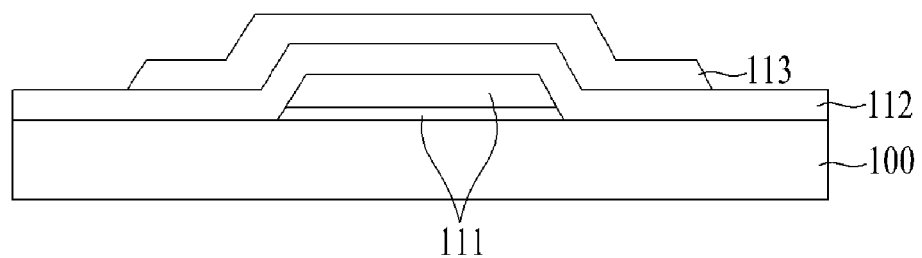

As illustrated in FIG. 2B, a gate insulating film 112 is then formed on a front surface of the substrate 100 using a material such as $SiO_2$, $SiN_x$, or the like so as to cover the gate electrode 111. In addition, an oxide semiconductor layer 113 is formed on the gate insulating film 112 to correspond to the gate electrode 111. The oxide semiconductor layer 113 is formed of an oxide including oxygen (O) and at least one element selected from a list of material of Ga, In, Zn, and Sn. For example, the oxide semiconductor layer 113 is formed of a mixed oxide such as InZnO, InGaO, InSnO, ZnSnO, GaSnO, GaZnO, GaInZnO, or the like.

An oxide TFT including the oxide semiconductor layer 113 has an effective charge mobility that is 10 times or more than that of an amorphous silicon TFT. In addition, an oxide TFT according to the present invention has a high mobility even when formed as a thin film at a low temperature, and changes in resistance according to an amount of oxygen. Thus, it may be easy to obtain desired physical properties.

Moreover, the oxide semiconductor layer 113 has a bandgap between about 3.0 eV and about 3.5 eV and thus substantially no optical leakage current with respect to visible light is generated. Thus, an instantaneous afterimage of the oxide TFT may be prevented.

Figure 2C:
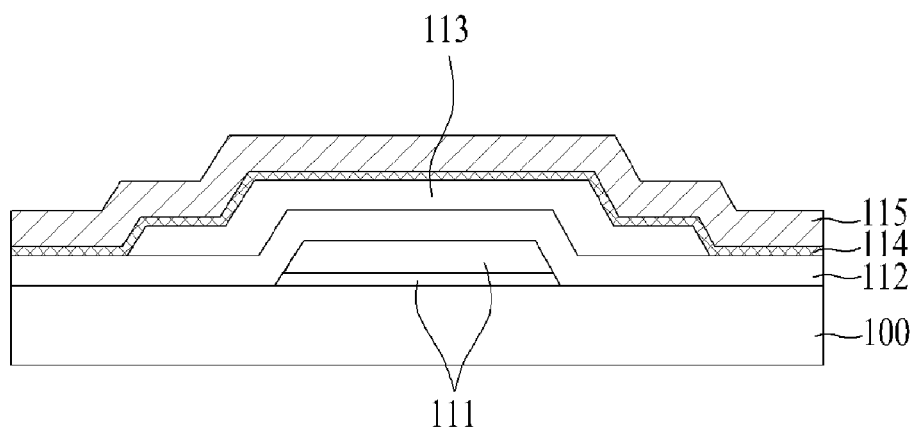

As illustrated in FIG. 2C, a lower data metal layer 114 and an upper data metal layer 115 are sequentially formed on the front surface of the substrate 100 so as to cover the oxide semiconductor layer 113. In general, source electrodes and drain electrodes are formed by patterning a data metal layer formed of Cu or a Cu alloy by a wet etching method using an etchant.

When forming source electrodes and drain electrodes, an etchant for patterning such a data metal layer reacts with a surface of the oxide semiconductor layer 113 having a weak chemical resistance. Accordingly, an oxide semiconductor layer formed below the source electrodes and drain electrodes is also subject to an etching. To prevent this, in a general oxide TFT, an etch stop layer is formed on the oxide semiconductor layer. In general, the etch stop layer is, however, formed by a chemical vapor deposition (CVD) method, the data metal layer is generally formed by a sputtering method, and a process of patterning the etch stop layer is further performed, thus increasing the manufacturing costs and time, which results in a reduced manufacturing yield.

In particular, when the etch stop layer is formed on the oxide semiconductor layer, two opposite side surfaces of the etch stop layer have a margin of approximately 2 μm in consideration of overlay margin. In this case, there is limitation in reducing the width of the etch stop layer, and the length of a channel, which corresponds to the width of the etch stop layer, thus increases. Accordingly, it may become difficult to drive such an oxide TFT at a high speed.

In addition, source electrodes and drain electrodes overlap the two opposite side surfaces of the etch stop layer at a certain distance, which increases parasitic capacitances ($C_{gs}$, $C_{gd}$) in the overlapping regions between the gate electrode and each of the source electrode and drain electrode. Accordingly, characteristics of a general oxide TFT may be degraded due to at least such a reduced mobility.

Therefore, according to a method of manufacturing an oxide TFT according to the present invention, the lower data metal layer 114 that may be patterned by a dry etching method and the upper data metal layer 115 that may be patterned by a wet etching method are sequentially stacked together. In addition, the upper data metal layer 115 and the lower data metal layer 114 may be sequentially patterned to prevent or minimize damage to the oxide semiconductor layer 113 during the formation of source and drain electrodes, without the need for forming a separate etch stop layer.

In this regard, the upper data metal layer 115 may be formed of Cu or a Cu alloy, and the lower data metal layer 114 may be formed of at least one material selected from a list of material of Mo, Ti, an Mo alloy, and a Ti alloy.

Figure 2D:
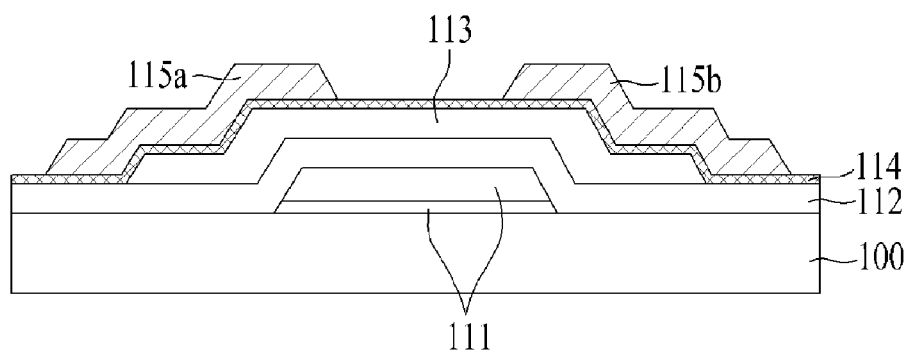

In particular, as illustrated in FIG. 2D, an upper source pattern 115a and an upper drain pattern 115b that are spaced apart from each other are formed by patterning the upper data metal layer 115 by a wet etching process. The lower data metal layer 114 is then exposed via the separation region between the upper source pattern 115a and the upper drain pattern 115b. Because the lower data metal layer 114 formed on the front surface of the oxide semiconductor layer 113 is not patterned by the wet etching process, the oxide semiconductor layer 113 is not exposed by the wet etchant.

That is, the lower data metal layer 114 prevents the wet etchant for etching the upper data metal layer 115 from reacting with the oxide semiconductor layer 113. In other words, the lower data metal layer 114 serves as an etch stop layer. The lower data metal layer 114 may have a thickness of about 500 Å.

Figure 2E:
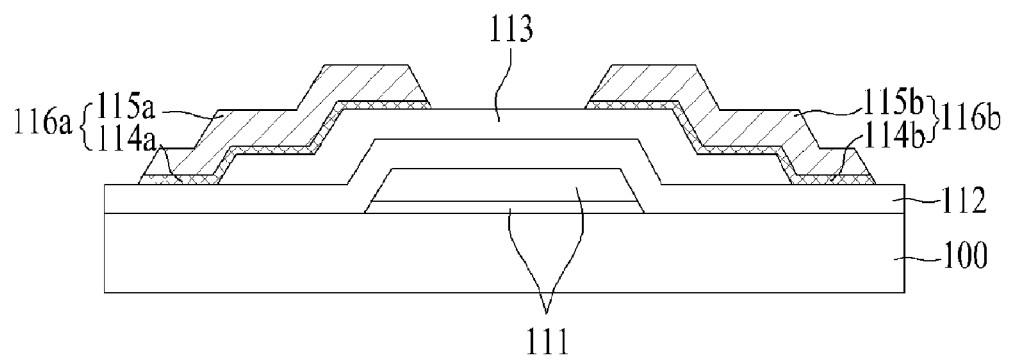

Subsequently, as illustrated in FIG. 2E, the lower data metal layer 114 is patterned using the upper source pattern 115a and the upper drain pattern 115b as a mask by a dry etching process using a mixed etching gas of $SF_6$ and $O_2$ or $CF_4$ and $O_2$. Accordingly, a lower source pattern 114a, an edge of which coincides with that of the upper source pattern 115a, and a lower drain pattern 114b, an edge of which coincides with that of the upper drain pattern 115b, are formed.

That is, an oxide TFT according to the present invention includes a source electrode 116a having a structure in which the upper source patterns 115a and the lower source patterns 114a are sequentially stacked and a drain electrode 116b having a structure in which the upper drain patterns 115b and lower drain patterns 114b are sequentially stacked. In this regard, a separation region between the source electrode 116a and the drain electrode 116b becomes a channel region of the oxide TFT, and a length of the channel region may be in a range between 3 μm and 10 μm, which may increase the on current and reduce the off current of the oxide TFT. In this regard, the off current may be 100 pA or less.

In particular, when the mixed etching gas of $SF_6$ and $O_2$ is used for the dry etching of the lower metal layer 114, sulfur and fluorine remain in the separation region between the source electrodes 116a and drain electrodes 116b, i.e., on an exposed surface of the oxide semiconductor layer 113. Similarly, when the mixed etching gas of $CF_4$ and $O_2$ is used, fluorine and carbon remain on the exposed surface of the oxide semiconductor layer 113. However, these sulfur, fluorine, and carbon do not adversely affect properties of the oxide semiconductor layer 113 as compared with the wet etchant.

Figure 2F:
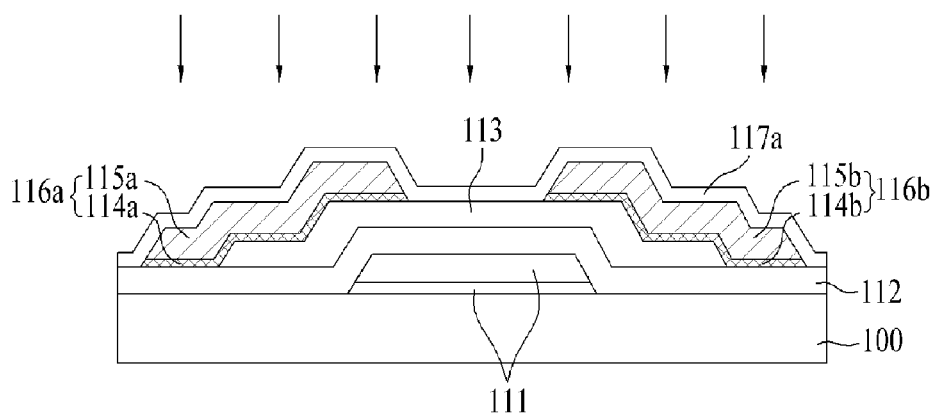

Next, as illustrated in FIG. 2F, a first passivation film 117a is formed on the front surface of the substrate 100 so as to cover the source electrodes 116a and drain electrodes 116b. In this regard, the first passivation film 117a may be formed of an inorganic material such as $SiN_x$, $SiO_2$, or the like by a CVD process and have a thickness of about 1,000 Å, which is similar to the thickness of a general etch stop layer.

After formation of the first passivation film 117a, a heat treatment is performed. The heat treatment reduces a resistance of the oxide semiconductor layer 113 to enhance characteristics of the oxide TFT. While a heat treatment is performed after the formation of an etch stop layer in a general oxide TFT, a heat treatment is performed after the formation of the first passivation film 117a in an oxide TFT according to the present invention. Thus, the first passivation film 117a may be formed of the same material as that of a general etch stop layer, i.e., $SiO_2$ or the like, as described above, and the first passivation film 117a may also have the same thickness as that of the general etch stop layer, i.e., about 1,000 Å.

Figure 2G:
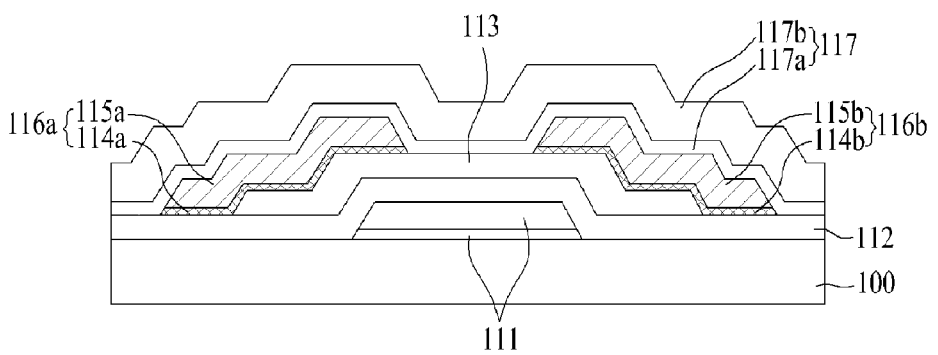

Afterwards, as illustrated in FIG. 2G, a second passivation film 117b is formed on the front surface of the first passivation film 117a. The second passivation film 117b may be formed of an organic material such as benzocyclobutene (BCB), acryl, or the like. The second passivation film 117b has a thickness of about 2,500 Å, and a total thickness of the first passivation films 117a and second passivation films 117b is about 3,500 Å.

In the oxide TFT fabrication method as described above, damage to the oxide semiconductor layer 113 may be prevented when patterning the lower data metal layer and the upper data metal layer by patterning the upper data metal layer using a wet etching process and patterning the lower data metal layer using a dry etching process without forming a separate etch stop layer. Thus, the manufacturing process may be simplified because no etch stop layer is formed, and there is no need to consider any manufacturing margin of such an etch stop layer.

In addition, the length of channel decreases, thus increasing the on current of the oxide TFT and reducing the off current and the parasitic capacitances ($C_{gs}$, $C_{gd}$). Accordingly, the mobility increases and thus characteristics of the oxide TFT are enhanced. In addition, the size of the oxide TFT decreases, and thus, an aperture ratio of an OLED display device including the oxide TFT may be improved. For these, an oxide TFT according to the present invention may be applied to a small and medium size, high-resolution OLED display device.

A method of manufacturing an oxide TFT according to the present invention may have the following advantages.

First, damage to the oxide semiconductor layer may be prevented by forming the source and drain electrodes sequentially using wet and dry etching processes, without forming a separate etch stop layer.

Second, the manufacturing process may be simplified, because no etch stop layer is formed and because there is no need to consider manufacturing margin of the etch stop layer. Thus, the length of channel decreases, thus increasing the on current of the oxide TFT increases and decreasing the off current and the parasitic capacitances ($C_{gs}$, $C_{gd}$). Accordingly, the mobility increases and thus characteristics of the oxide TFT are enhanced.

Third, the size of the oxide TFT decreases, and thus, an aperture ratio of an OLED display device including the oxide TFT may be improved. An oxide TFT according to the present invention may be applied to a small and medium size, high-resolution OLED display device.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing an oxide thin film transistor, the method comprising:
   forming a gate electrode on a substrate;
   forming a gate insulating film on a front surface of the substrate including the gate electrode;
   forming an oxide semiconductor layer on the gate insulating film;
   sequentially forming a lower data metal layer and an upper data metal layer on the front surface of the substrate including the oxide semiconductor layer;
   forming an upper source pattern and an upper drain pattern by patterning the upper data metal layer by a wet etching;
   forming a lower source pattern and a lower drain pattern by patterning only the lower data metal layer by a dry etching using the upper source pattern and the upper drain pattern as a mask to form a source electrode including the lower source pattern and the upper source pattern and a drain electrode including the lower drain pattern and the upper drain pattern and spaced apart from the source electrode;
   forming a first passivation film on the front surface of the substrate including the source and drain electrodes;

performing a heat treatment on the oxide semiconductor layer by applying heat to the oxide semiconductor layer through the first passivation film; and forming a second passivation film on the first passivation film.

2. The method according to claim 1, wherein the first passivation film includes $SiO_2$.

3. The method according to claim 1, wherein the lower data metal layer and the upper data metal layer are sequentially formed by a sputtering method.

4. The method according to claim 1, wherein the upper data metal layer includes copper (Cu) or a Cu alloy.

5. The method according to claim 1, wherein the lower data metal layer includes at least one of molybdenum (Mo), titanium (Ti), an Mo alloy, and a Ti alloy.

6. The method according to claim 1, wherein the drain electrode is spaced apart from the source electrode at a distance between about 3 and about 10 μm.

7. The method according to claim 1, wherein the dry etching uses a mixed etching gas including $SF_6$ and $O_2$ or a mixed etching gas including $CF_4$ and $O_2$.

8. The method according to claim 7, wherein sulfur and fluorine remain in a separation region between the source and drain electrodes when the mixed etching gas including $SF_6$ and $O_2$ is used, and fluorine and carbon remain in the separation region between the source and drain electrodes when the mixed etching gas including $CF_4$ and $O_2$ is used.

* * * * *